United States Patent [19]

Inaba et al.

[11] Patent Number: 5,350,950

[45] Date of Patent: Sep. 27, 1994

[54] SETTING CIRCUIT OF BINARY THRESHOLD VALUE

[75] Inventors: Naoto Inaba, Tokyo; Shinichi Tanaka, Kamakura, both of Japan

[73] Assignee: Nikon Corporation, Tokyo, Japan

[21] Appl. No.: 983,736

[22] Filed: Dec. 1, 1992

[30] Foreign Application Priority Data

Dec. 4, 1991 [JP] Japan ................. 3-320240

[51] Int. Cl.$^5$ ........................... H03K 5/153
[52] U.S. Cl. ................. 307/236; 307/549; 307/503; 307/351; 328/162
[58] Field of Search ............. 307/356, 503, 517, 363, 307/559, 321, 236, 317.1, 547, 549, 351; 328/162, 163

[56] References Cited

U.S. PATENT DOCUMENTS

| | | | |
|---|---|---|---|
| 3,386,042 | 5/1968 | Moes | 307/317.1 |
| 3,497,723 | 2/1970 | Nelson | 328/162 |
| 3,566,145 | 2/1971 | Goodale | 307/317.1 |
| 3,597,633 | 8/1971 | Hirano | 307/321 |
| 3,885,168 | 5/1975 | Matsuzaki | 307/517 |
| 3,916,326 | 10/1975 | Woyton | 307/236 |
| 4,194,240 | 3/1980 | Davis | 307/317.1 |
| 4,362,996 | 12/1982 | Priebe | 307/358 |
| 4,423,478 | 12/1983 | Bullock et al. | 307/356 |
| 4,751,468 | 6/1988 | Agoston | 307/321 |
| 4,852,164 | 7/1989 | Suzuki | 307/356 |

Primary Examiner—Timothy P. Callahan
Assistant Examiner—T. T. Lam
Attorney, Agent, or Firm—Shapiro and Shapiro

[57] ABSTRACT

A binary threshold value setting circuit comprises: a first detecting section to detect the positive polarity side of an input signal, a second detecting section to detect the negative polarity side of the signal; a first envelope detecting section to perform an envelope detection to the signal detected by the first detecting section, a second envelope detecting section to perform an envelope detection to the signal detected by the second detecting section, a threshold value setting section to generate a signal at a level between the level of the signal which has been envelope detected by the first envelope detecting section and the level of the signal which has been envelope detected by the second envelope detecting section, and a capacitor connected between the output side of the first detecting section and the output side of the second detecting section.

11 Claims, 3 Drawing Sheets

SETTING CIRCUIT OF BINARY THRESHOLD VALUE

BACKGROUND OF THE INVENTION

Field of the Invention

The invention relates to a binary threshold value setting circuit for setting a threshold value in case of binarizing an analog signal.

Related Background Art

FIG. 1 is a circuit diagram showing a conventional binary threshold value setting circuit. In the diagram, a coupling capacitor 1 allows only an AC signal component of an analog signal to pass. A buffer 2 gain-generates the analog signal of the AC wave component from the coupling capacitor 1. Diodes 3 and 4 detect the analog signal from the buffer 2 to the positive and negative polarities, respectively. Envelope detecting capacitors 5 and 6 envelope detect the signals to the positive and negative polarities by the diodes 3 and 4, respectively. A resistor 7 is connected between an anode of the diode 3 and a cathode of the diode 4 and allows the charges accumulated in the capacitors 5 and 6 to be discharged. A buffer 8 gain-generates the signal which has been envelope detected to the positive polarity by the diode 3 and capacitor 5. A buffer 9 gain-generates the signal which has been envelope detected to the negative polarity by the diode 4 and capacitor 6. Resistors 10 and 11 are connected so as to add the gain outputs of the buffers 8 and 9 and to thereby obtain an output of an intermediate potential. A buffer 12 gain-generates (output of a threshold value signal) by the signal derived through the resistors 10 and 11.

With the above construction, the analog signal is envelope detected on the positive and negative polarity sides, respectively. An intermediate potential of the envelope detected signal levels can be obtained as an output of the buffer 12. The analog signal is binarized by using an output from the buffer 12 as a threshold value. That is, the signal (AC signal component of the analog signal) from the coupling capacitor 1 and the threshold value signal from the buffer 12 are voltage-divided by resistors 13 and 14, respectively, and supplied to an operational amplifier 15, so that a binary signal obtained as an output of the operational amplifier 15.

Such a binary threshold value setting circuit is used, for instance, to reproduce a signal recorded on a recording medium such as an optical disc or the like and to binary a reproduction signal.

The conventional binary threshold value setting circuit as mentioned above has the following problems.

FIG. 2 is a diagram showing a state of a threshold value level due to a fluctuation of the analog signal. For example, when the analog signal largely fluctuates on the positive polarity side (c in FIG. 2) for the ordinary level due to noise or the like, the threshold level also changes in accordance with such a fluctuation of the analog signal. Even after the analog signal has returned to the normal level after that, the threshold value is not returned to the inherent level for a little while (time t in FIG. 2). This is because a delay occurs by a time constant of the capacitor and resistor (5 and 7 in FIG. 1) for detection of the positive polarity envelope. Therefore, the operation to binarize the analog signal is not normally executed for the time t. To reduce the time t, it is considered to reduce the time constant by decreasing the value of the resistor 7. When the time constant is decreased, the envelope detecting capability deteriorates and the threshold value setting precision deteriorates.

When the analog signal level largely fluctuates for the ordinary level as mentioned above, there is a problem such that the threshold value is set to an improper level within a certain time and the binarizing operation is not correctly performed. As a cause of the large fluctuation of the analog signal level, in the case where the analog signal is the reproduction signal read out from the optical disc, a case where a defect exists in a track on the optical disc on which information has been recorded or the like is considered.

SUMMARY OF THE INVENTION

The invention is made to solve the above problems and it is an object of the invention to provide a binary threshold value setting circuit which can accurately set a threshold value even when an analog signal fluctuates.

According to the invention, there is provided a binary threshold value setting circuit that comprises: a positive polarity detecting section to detect the positive polarity of an analog signal; a negative polarity detecting section to detect the negative polarity of the analog signal; a positive polarity envelope detecting section to perform an envelope detection to the signal detected by the positive polarity detecting section; a negative polarity envelope detecting section to perform an envelope detection to the signal detected by the negative polarity detecting section; and a threshold value setting section for generating a signal of a level between the signal level which has been envelope detected by the positive polarity envelope detecting section and the signal level which has been envelope detected by the negative polarity envelope detecting section as a threshold value signal, wherein a capacitor is connected between the positive polarity detecting section and the negative polarity detecting section.

A discharging section to discharge the charges charged in the positive polarity envelope detecting section and the negative polarity envelope detecting section is provided between the output side of the positive polarity envelope detecting section and the output side of the negative polarity envelope detecting section.

According to the invention, the analog signal is detected to the positive polarity and negative polarity by the positive polarity detecting section and negative polarity detecting section, respectively. The signal detected to the positive polarity is envelope detected by the positive polarity envelope detecting section. The signal detected to the negative polarity is envelope detected by the negative polarity envelope detecting section. The detected positive and negative polarity signals are supplied to the threshold value setting section. The threshold value setting section generates a threshold value signal by using a level between the signal level detected by the positive polarity envelope detecting section and the signal level detected by the negative polarity envelope detection section as a threshold value. When the analog signal level suddenly fluctuates, the capacitor follows the fluctuation amount, thereby allowing the detected positive and negative polarity signals to be fluctuated. The fluctuated signals are supplied to the threshold value setting section through the positive and negative polarity envelope detecting sections.

By providing the discharging section, the charges which are charged into the positive polarity envelope detecting section or negative polarity envelope detecting section can be discharged.

DETAILED DESCRIPTION OF THE PREFERRED EMBODIMENTS

Figure 1:
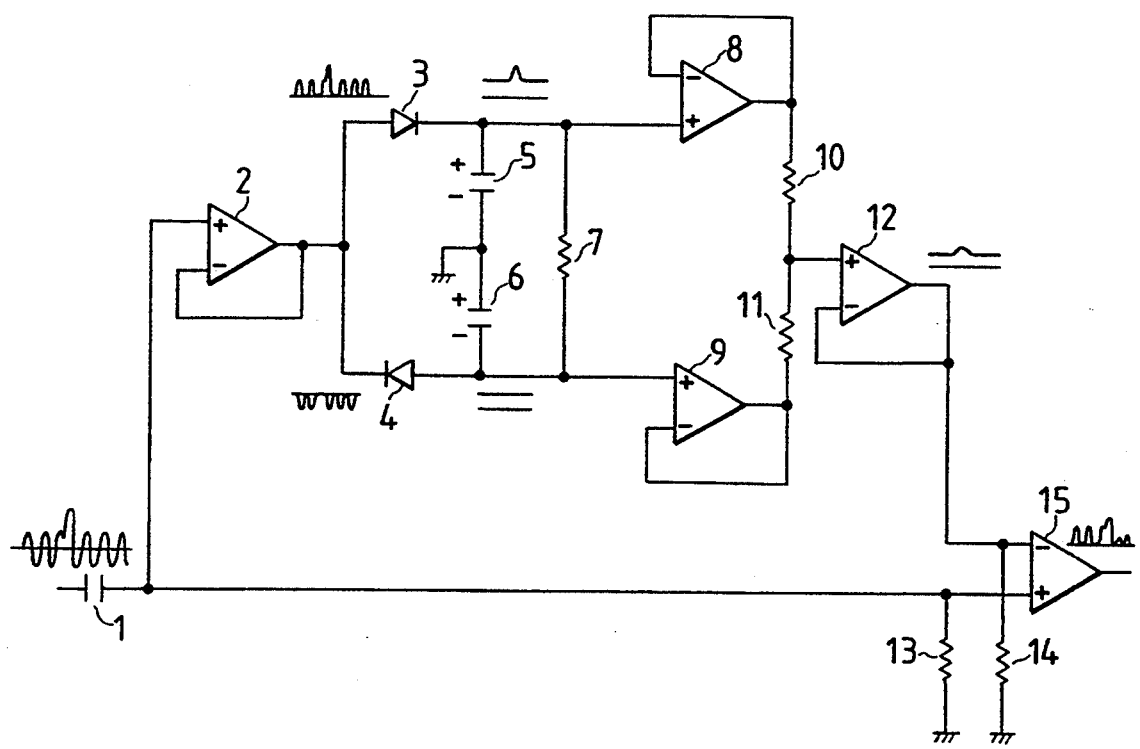
FIG. 1 is a circuit diagram showing a conventional binary threshold value setting circuit.
Figure 2:
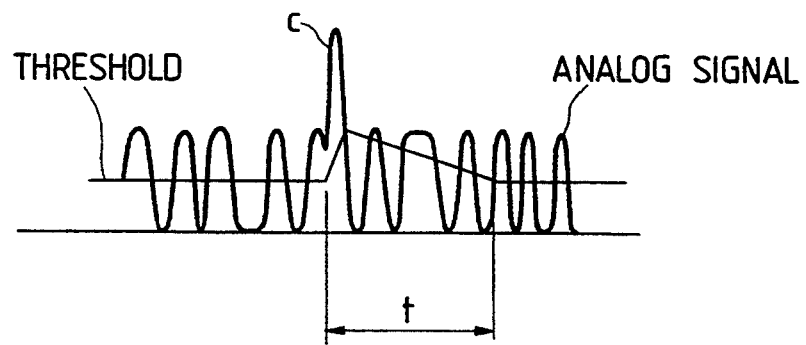
FIG. 2 is a diagram showing a state of a threshold value level due to a fluctuation of an analog signal in FIG. 1.
Figure 3:
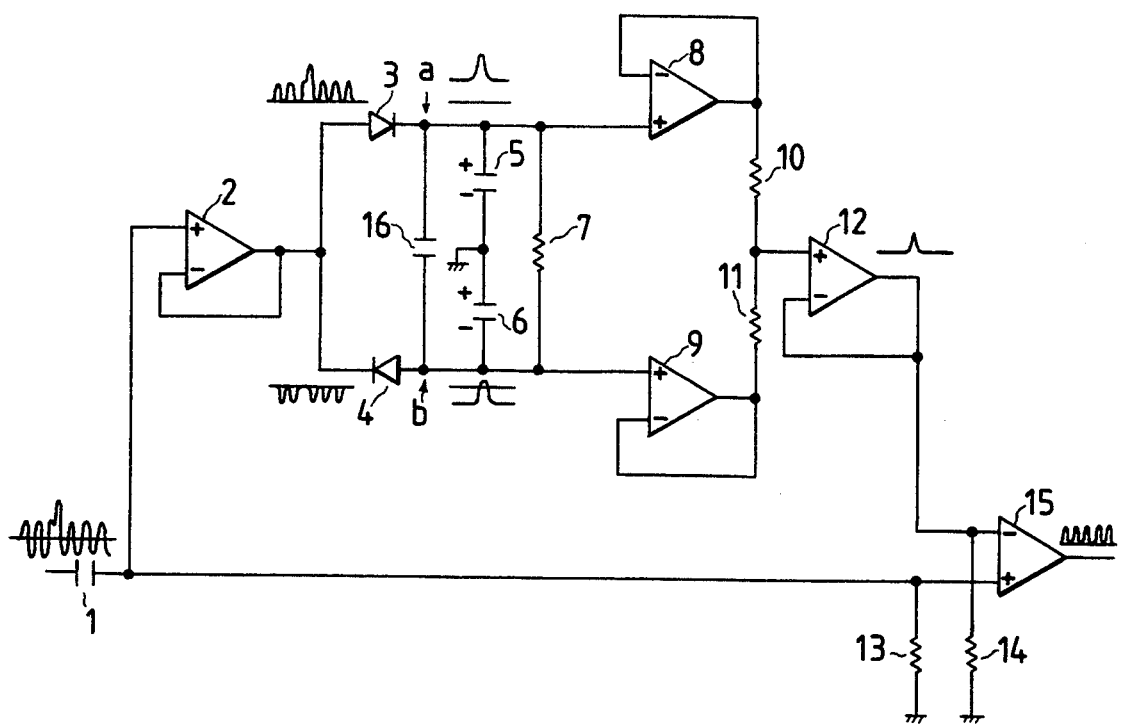
FIG. 3 is a circuit diagram showing an embodiment of the invention.

FIG. 3 is a circuit diagram showing an embodiment of the invention. Reference numerals 1 to 15 denote the same component elements as those in the conventional circuit of FIG. 1. In FIG. 3, a capacitor 16 is connected between the anode of the diode 3 and the cathode of the diode 4. It is preferable that a capacitance of the capacitor 16 is larger than capacitances of the smoothing capacitors 5 and 6. More preferably, it is desirable that the capacitor 16 has a capacitance which is tens of times as large as the capacitances of the smoothing capacitors 5 and 6.

Figure 4:
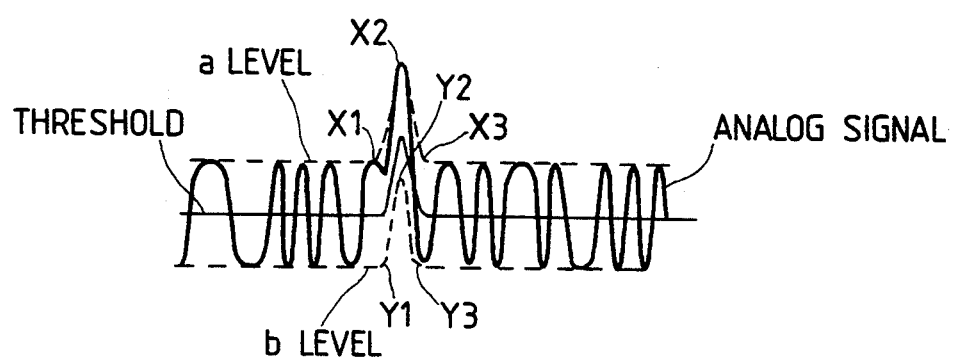
FIG. 4 is an explanatory diagram showing a state of a threshold value due to a fluctuation of an analog signal in FIG. 3.

The binary threshold value setting circuit of the invention is constructed as mentioned above. FIG. 4 is an explanatory diagram showing a state of a threshold value level due to a fluctuation of an analog signal in FIG. 3. The operation will now be described. First, when the ordinary analog signal is supplied through the coupling capacitor 1 and buffer 2, the analog signal given with a gain by the buffer 2 is detected by the diodes 3 and 4. Output signals of the diodes 3 and 4 are envelope detected by the capacitors 5 and 6, respectively. The envelope detected voltages are respectively supplied to positive input terminals of the buffers 8 and 9. The buffers 8 and 9 gain-generate the envelope detected signals. These two output signals are added through the resistors 10 and 11, so that the signal corresponding to the intermediate potential of the analog signal is supplied to the buffer 12. The buffer 12 supplies the signal given with a gain from the input signal to an inverting input terminal of the operational amplifier 15 as a threshold signal. The operational amplifier 15 uses the threshold signal as a threshold value and detects the analog signal which is supplied through the coupling capacitor 1 and binarizes.

On the other hand, when the analog signal temporarily suddenly fluctuates to the positive polarity side and the fluctuated analog signal is supplied in a manner similar to that mentioned above, the signals which were respectively detected to the positive polarity side and negative polarity side are generated so as to follow the fluctuation amount of the analog signal by the function of the capacitor 16. Such states will now be described with reference to FIGS. 3 and 4. When the analog signal of the positive polarity which suddenly fluctuates is supplied to the capacitor 16, the level at a point a in FIG. 3 suddenly rises in the direction of the positive polarity ($X_1 \rightarrow X_2$) (a charge amount of the capacitor 6 for envelope detection also increases). Since a voltage drop across the capacitor 16 is small, the level at a point b in FIG. 3 also suddenly follows and rises in the positive polarity direction ($Y_1 \rightarrow Y_2$). On the contrary, when the elevated level at the point a suddenly drops ($X_2 \rightarrow X_3$), the level at the point b also similarly suddenly drops ($Y_2 \rightarrow Y_3$) and follows.

As mentioned above, the detected signals on the positive and negative polarity sides fluctuate by the capacitor 16 and the fluctuation signals are supplied to the buffers 8 and 9, respectively. The buffers 8 and 9 gain the fluctuation amounts. The value added through the resistors 10 and 11 (namely, intermediate potential between the above fluctuation signal and a fluctuation signal having a level difference in a manner similar to such a fluctuation signal) is sent to the buffer 12. The buffer 12 gains the intermediate value of a difference between those fluctuation components and generates as a threshold signal to the operational amplifier 15. The fluctuations of the outputs of the buffers 8 and 9 in association with the level fluctuations at the points a and b as mentioned above are shown as fluctuations of the a and b levels in FIG. 4.

As mentioned above, the level at the b point is fluctuated so as to follow the fluctuating level at the a point by the capacitor 16. The intermediate value of the difference between those fluctuation levels is set to a threshold value for binarization of the analog signal. Therefore, the threshold value is set in correspondence to the fluctuating analog signal supplied from the coupling capacitor 1. The analog signal is normally binarized and generated.

Although the case where the analog signal fluctuated on the positive polarity side has been described in the embodiment, by reversing the polarity of the capacitor 16, the invention can also cope with the fluctuation on the negative polarity side.

In the embodiment, the intermediate value between the signal levels which had been envelope detected to the positive and negative polarity sides has been set to the threshold value. It is, however, not always necessary to set the threshold value to the intermediate value. The threshold value can be also selected to an arbitrary value between the two envelope detected signal levels by adjusting the resistance values of the resistors 10 and 11 or the like.

Figure 5:
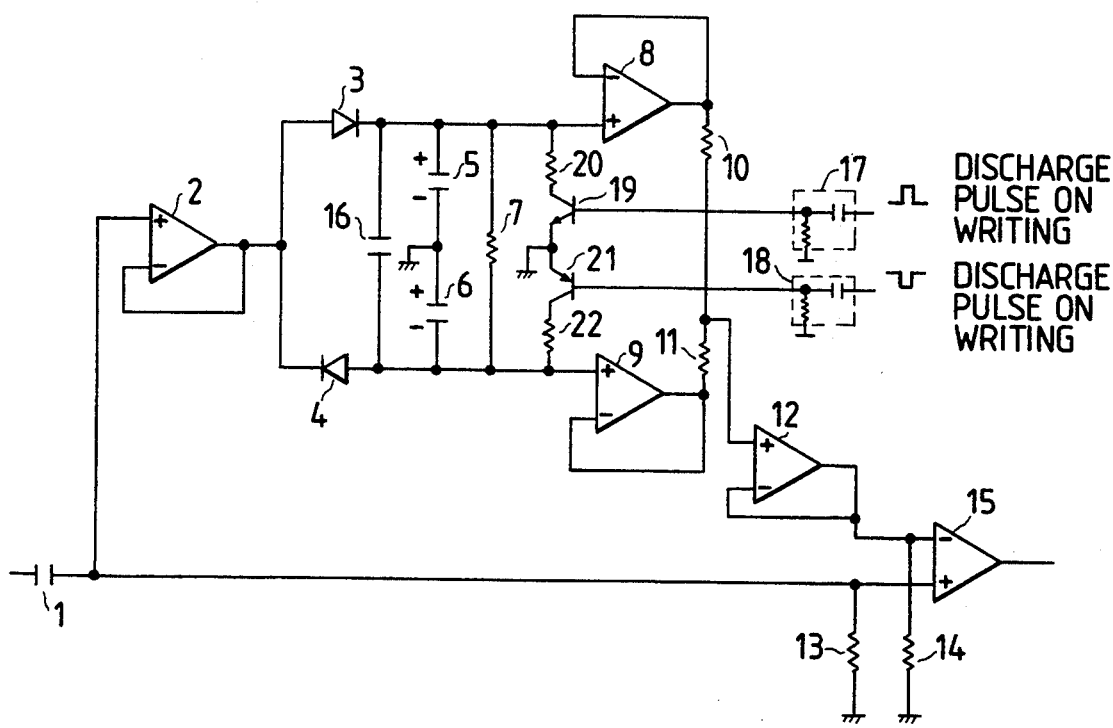
FIG. 5 is a circuit diagram showing a binary threshold value setting circuit according to another embodiment.

FIG. 5 is a circuit diagram showing a binary threshold value setting circuit according to another embodiment. Reference numerals 1 to 16 denote the same component elements as those shown in FIG. 3. In FIG. 5, reference numerals 17 and 18 denote differentiating circuits each of which is constructed by a capacitor and a resistor. Two discharge pulses having different polarities are respectively supplied to the differentiating circuits 17 and 18. Each of the differentiating circuits 17 and 18 makes its leading characteristics sharp and generates a pulse. Reference numeral 19 denotes an NPN type transistor which is connected in parallel to the positive input terminal of the buffer 8 through a resistor 20. The transistor 19 is turned on by the discharge pulse from the differentiating circuit 17, thereby discharging through the resistor 20 the charges of the positive polarity accumulated in the capacitor 5 for envelope detection of the positive polarity. Reference numeral 21 denotes a PNP type transistor connected in parallel to the positive input terminal of the buffer 9 through a resistor 22. The transistor 21 is turned on by the discharge pulse from the differentiating circuit 18, thereby discharging through the resistor 22 the charges of the negative polarity accumulated in the capacitor 6 for envelope detection of the negative polarity.

For instance, when an amplitude of the analog signal is large, a large amount of charges are charged into the envelope detecting capacitors 5 and 6, so that there is a case where it takes a long time to discharge through the resistor 7 due to a time constant of the resistor and capacitor and all of the charges cannot be completely discharged. In such a case, the discharge pulses of different polarities are supplied to the differentiating circuits 17 and 18 and the transistors 19 and 21 are turned on, thereby discharging the charges charged in the capacitors 5 and 6, respectively. Consequently, the operation to set the threshold value is normally performed.

The case where the binary threshold value setting circuit with the construction as mentioned above is applied to a magnetooptic disc apparatus will now be described. In the magnetooptic disc apparatus, a laser beam is radiated onto a magnetooptic disc comprising a magnetization film having a perpendicular magnetic anisotropy, a temperature is locally raised, a magnetic field is also simultaneously applied from the outside and the magnetization of the local area is directed to the direction of the magnetic field, thereby recording information. Since both of the light and the magnetic field are used in the magnetooptic recording as mentioned above, a magnetic field modulating method whereby a signal is converted in the direction of the magnetic field and recorded and a light modulating method whereby a signal is converted into the on/off states of the laser beam and recorded are considered.

The magnetic Kerr effect is used to reproduce the information recorded as mentioned above. When the laser beam is radiated onto the magnetization film, a Kerr rotational angle of a polarization plane of the reflected light is proportional to the magnetization of the magnetization film and its rotating direction differs in dependence on the magnetizing direction. The recorded information can be read out by detecting the rotating direction.

In the recording or erasing mode, it is necessary that a laser beam which is strong to a certain degree be radiated and a temperature of the magnetization film is raised, thereby decreasing a coercive force of the magnetization film up to a magnitude at which the magnetization is reversed by the external magnetic field. In the reproducing mode, however, a laser beam which is weak to a certain degree such that the magnetization is not reversed is radiated. A light intensity of the laser beam in the reproducing mode, therefore, is weaker than that in the recording or erasing mode. The reflected light of the laser beam radiated onto the magnetooptic disc is received by a photosensitive device and is converted into the electric signal and the signal is amplified by an amplifier, so that a reproduction signal is derived. Binary data is obtained by binarizing the reproduction signal by the binary threshold value setting circuit and binarizing circuit as mentioned above.

However, in the recording or erasing mode, there is a case where the level of the signal which is supplied to the binary threshold value setting circuit is in an unspecified state and a signal of a very large amplitude is supplied. The light intensity of the laser beam in the recording or erasing mode is larger than that in the reproducing mode and the intensity of the reflected light which enters the photosensitive device is also large. Thus, the photosensitive device and the amplifier enter the saturation state and it is impossible to presume to which levels their output signals are set (namely, unspecified state). Since the intensity of the incident light to the photosensitive device is large, a possibility such that the signal of a very large amplitude is supplied to the binary threshold value setting circuit is high. Therefore, there is a case where after completion of the recording or erasing operation, a large amount of charges have been charged in the capacitors 5 and 6 in the envelope detecting section of the binary threshold value setting circuit. In such a case, by supplying the discharge pulses to the differentiating circuits 17 and 18 as mentioned above, the charged charges can be discharged.

Figure 6:
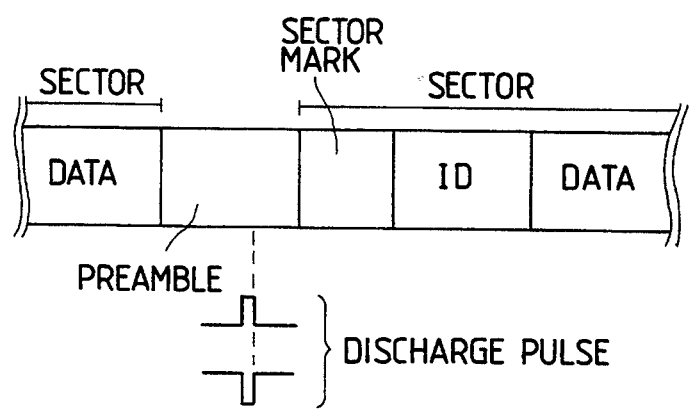
FIG. 6 is a diagram showing a part of a track format.

The timing to generate the discharge pulses will now be described. Generally, a plurality of concentric or spiral tracks are formed on the recording surface of the magnetooptic disc. Each track is divided into recording units called sectors. FIG. 6 shows a part of a track format. The sector comprises a sector mark, an ID portion, and a data portion. There is an area called a preamble between a certain sector and the next sector. The sector mark is a mark indicative of the head portion of the sector. A track address and a sector address are recorded in the ID portion. User's data is recorded in the data portion. When the user's data is recorded, the sector mark is first read and the ID is subsequently read, thereby judging whether the sector is a sector to be recorded or not. In the reproducing mode as well, by reading the sector mark and the ID, a check is made to see if the sector is a desired sector or not. In FIG. 6, it is now assumed that the laser beam moves from the left to the right. For example, the case where information is recorded into the data portion of the left sector and the sector mark and the ID of the right sector are subsequently reproduced will be considered.

After completion of the recording to the left sector, the laser beam passes through the preamble portion. The setting of the apparatus to reproduce the sector mark and ID of the next sector is executed during the passage in the preamble portion. After completion of the recording to the left sector, there is a possibility such that a large amount of charges have been charged in the capacitors 5 and 6 in the envelope detecting section of the binary threshold value setting circuit. There is a case where all of the charges cannot be perfectly discharged through the resistor 7 for a period of time when the laser beam passes through the preamble portion. Therefore, by detecting the passage of the laser beam in the preamble portion and by generating the discharge pulses, the charged charges are discharged before the reproduction of the left sector mark is started. Consequently, the reproduction signal obtained by reading the left sector mark and ID can be accurately binarized.

According to the invention as mentioned above, even when the analog signal level suddenly changes, the threshold value can be correctly set without being influenced by the time constant of the envelope detection and the analog signal can be correctly binarized.

Even for the analog signal of a large amplitude, the charges in the envelope detecting section are soon discharged, so that the correct threshold value is set without being influenced by the residual charges in the detecting section and the analog signal can be correctly binarized.

What is claimed is:

1. A binary threshold value setting circuit comprising:
- a first detecting section to detect the positive polarity side of an input signal;
- a second detecting section to detect the negative polarity side of said signal;
- a first envelope detecting section connected to said first detecting section to perform an envelope detection to the signal detected by the first detecting section;
- a second envelope detecting section connected to said second detecting section to perform an envelope detection to the signal detected by the second detecting section;
- a threshold value setting section connected to said first and second envelope detecting sections to generate a signal at a level between the level of the signal which has been envelope detected by the first envelope detecting section and the level of the signal which has been envelope detected by the second envelope detecting section;
- a capacitor connected between an output side of the first detecting section and an output side of the second detecting section;
- a controllable discharge section, connected between an output side of the first envelope detecting section and an output side of the second envelope detecting section, for allowing the charges charged in the first and second envelope detecting sections to be discharged; and
- said controllable discharge section including first and second switching devices connected for respectively discharging each of said first and second envelope detecting section.

2. A binary threshold value setting circuit comprising:
- a first detecting section to detect the positive polarity side of an input signal;
- a second detecting section to detect the negative polarity side of said signal;
- a first capacitor connected to said first detecting section to perform an envelope detection to the signal detected by the first detecting section;
- a second capacitor connected to said second detecting section to perform an envelope detection to the signal detected by the second detecting section;
- a threshold value setting section connected to said first and second capacitors to generate a signal at a level between the level of the signal which has been envelope detected by the first capacitor and the level of the signal which has been envelope detected by the second capacitor;
- a third capacitor which is connected between an output side of the first detecting section and an output side of the second detecting section and has a capacitance larger than capacitances of the first and second capacitors;
- a resistor connected between an output side of the first capacitor and an output side of the second capacitor; and
- a switching device connected between the output side of the first capacitor and the output side of the second capacitor, said switching device being connected in paralleled with said first and second capacitors.

3. A circuit according to claim 1, further including:
- means, connected to said controllable discharge section, for generating a discharge pulse to allow the first and second switching devices to execute the switching operation.

4. A binary threshold value setting circuit comprising:
- a first detecting section to detect the positive polarity side of an input signal;
- a second detecting section to detect the negative polarity side of said signal;
- a first envelope detecting section connected to said first detecting section to perforth an envelope detection to the signal detected by the first detecting section;
- a second envelope detecting section connected to said second detecting section to perform an envelope detection to the signal detected by the second detecting section;
- a threshold value setting section connected to said first and second envelope detecting sections to generate a signal at a level between the level of the signal which has been envelope detected by the first envelope detecting section and the level of the signal which has been envelope detected by the second envelope detecting section;
- a capacitor connected between an output side of the first detecting section and an output side of the second detecting section;
- a first discharge section, connected to an output side of the first envelope detecting section, for allowing the charges charged in the first envelope detecting section to be discharged; and
- a second discharge section, connected to an output side of the second envelope detecting section, for allowing the charges charged in the second envelope detecting section to be discharged.

5. A circuit according to claim 4, wherein said first and second discharge section include respectively a first and second switching devices.

6. A circuit according to claim 5, further including:
- first means, connected to the first switching device, for generating a first discharge pulse to allow the first switching device to perform the switching operation; and
- second means, connected to the second switching device, for generating a second discharge pulse to allow the second switching device to perform the switching operation.

7. A circuit according to claim 2, further including:
- means, connected to the switching device, for generating a discharge pulse to allow the switching device to perform the switching operation.

8. A binary threshold value setting circuit comprising:
- a first detecting section to detect the positive polarity side of an input signal;
- a second detecting section to detect the negative polarity side of said signal;
- a first capacitor connected to said first detecting section to perform an envelope detection to the signal detected by the first detecting section;
- a second capacitor connected to said second detecting section to perform an envelope detection to the signal detected by the second detecting section;
- a threshold value setting section connected to said first and second capacitors to generate a signal at a level between the level of the signal which has been envelope detected by the first capacitor and the level of the signal which has been envelope detected by the second capacitor;

a third capacitor which is connected between an output side of the first detecting section and an output side of the second detecting section and has a capacitance larger than capacitances of the first and second capacitors;

a first resistor connected to an output side of the first capacitor at one end thereof, and grounded at the other end through a first switching device; and a second resistor connected to an output side of the second capacitor at one end thereof, and grounded at the other end through a second switching device.

9. A circuit according to claim 8, further including:

first means, connected to the first switching device, for generating a first discharge pulse to allow the first switching device to perform the switching operation; and second means, connected to the second switching device, for generating a second discharge pulse to allow the second switching device to perform the switching operation.

10. A circuit according to claim 3, wherein said input signal is a reproduction signal derived by reproducing a magnetooptic disc, and wherein said means for generating a discharge pulse generates a discharge pulse after a completion of recording in a sector on a recording surface of said magnetooptic disc and before a commencement of reproducing a following sector.

11. A circuit according to claim 7, wherein said input signal is a reproduction signal derived by reproducing a magnetooptic disc, and wherein said means for generating a discharge pulse generates a discharge pulse after a completion of recording in a sector on a recording surface of said magnetooptic disc and before a commencement of reproducing a following sector.

* * * * *